United States Patent [19]

Jones et al.

[11] Patent Number: 4,949,610
[45] Date of Patent: Aug. 21, 1990

[54] BOARD-SUPPORTING ASSEMBLY FOR FLUID JET CUTTING SYSTEM

[76] Inventors: Edward P. Jones, 4115 - 209th Ct., NE., Redmond, Wash. 98052; G. Duncan Murdock, 14505 SE. 254th Ave., Kent, Wash. 98042; Geoffrey J. Dean, 9633 - 26th Ave., NW., Seattle, Wash. 98117

[21] Appl. No.: 723,428

[22] Filed: Apr. 15, 1985

[51] Int. Cl.$^5$ ............................................. B26F 3/00
[52] U.S. Cl. ...................................... 83/177; 83/155; 83/451; 269/903
[58] Field of Search ................... 83/53, 177, 155, 451; 198/798, 800; 428/316.6, 247; 269/21, 316, 903

[56]  References Cited

U.S. PATENT DOCUMENTS

| | | | |
|---|---|---|---|
| 3,395,439 | 8/1968 | Palesi et al. | 269/903 |
| 3,877,334 | 4/1985 | Gerber | 83/22 |
| 3,927,591 | 12/1978 | Gerber | 83/177 |
| 4,060,280 | 11/1977 | Van loo | 428/316.6 |
| 4,067,758 | 1/1978 | Sommer | 428/316.6 |
| 4,112,797 | 9/1978 | Pearl | 83/177 |
| 4,204,448 | 5/1980 | Pearl | 83/177 |

FOREIGN PATENT DOCUMENTS

| | | | |
|---|---|---|---|
| 106538 | 2/1939 | Australia | 83/431 |
| 2720547 | 11/1977 | Fed. Rep. of Germany | 83/177 |

Primary Examiner—Frank T. Yost
Assistant Examiner—Hien H. Phan

[57] ABSTRACT

A platen assembly is described for supporting a master board of material to be cut by a fluid jet cutting device. The platen assembly comprises a layer of resiliently compressible material bonded to a lattice-like network of relatively uncuttable structural material. The resiliently compressible material is adapted to be compressed by the contacting topography of the supported master board to act as a cushion, as well as to anchor the master board against movement. The lattice-like network of relatively uncuttable structurable material prevents the compressible material on opposite sides of a cut from migrating towards the cut.

24 Claims, 10 Drawing Sheets

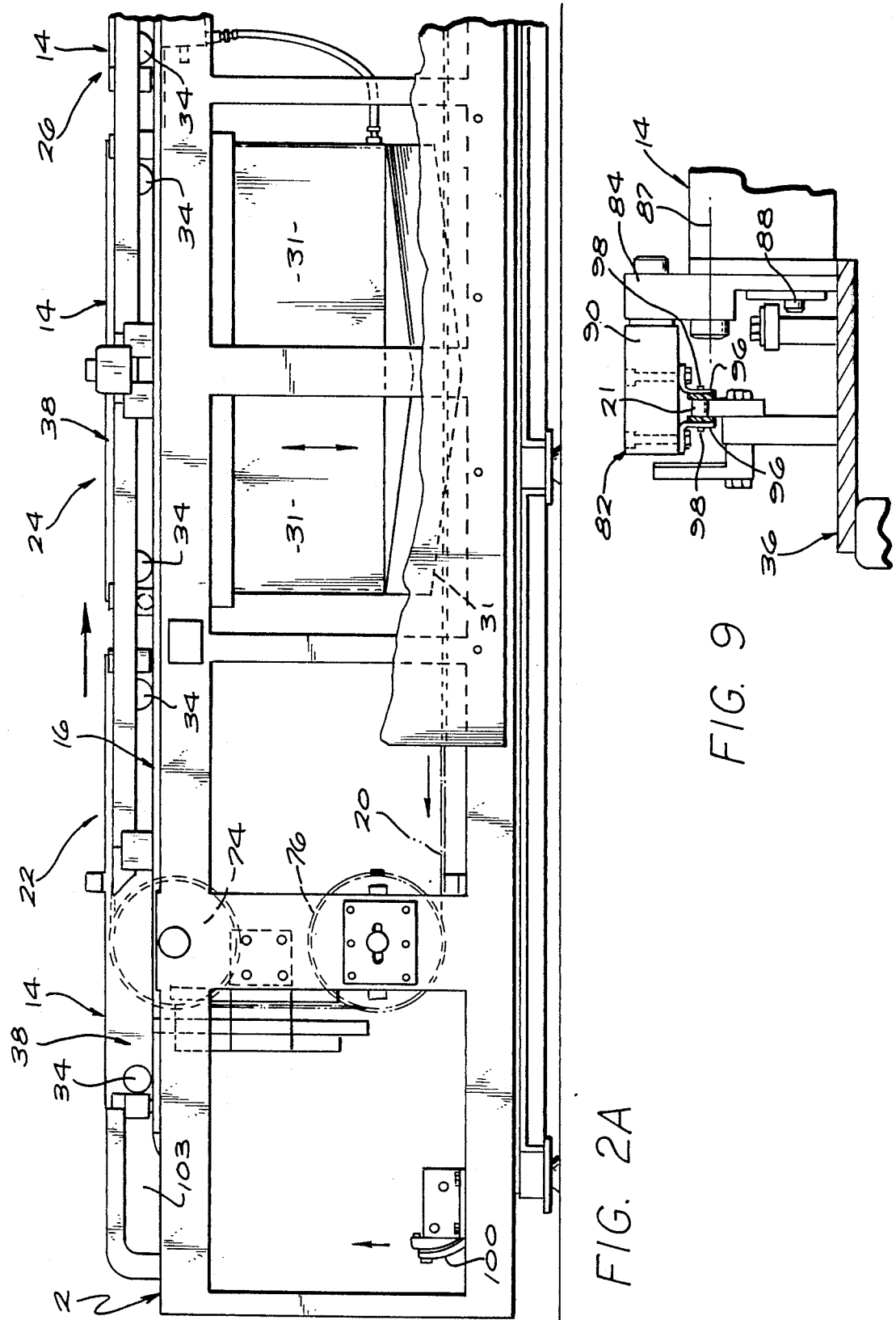

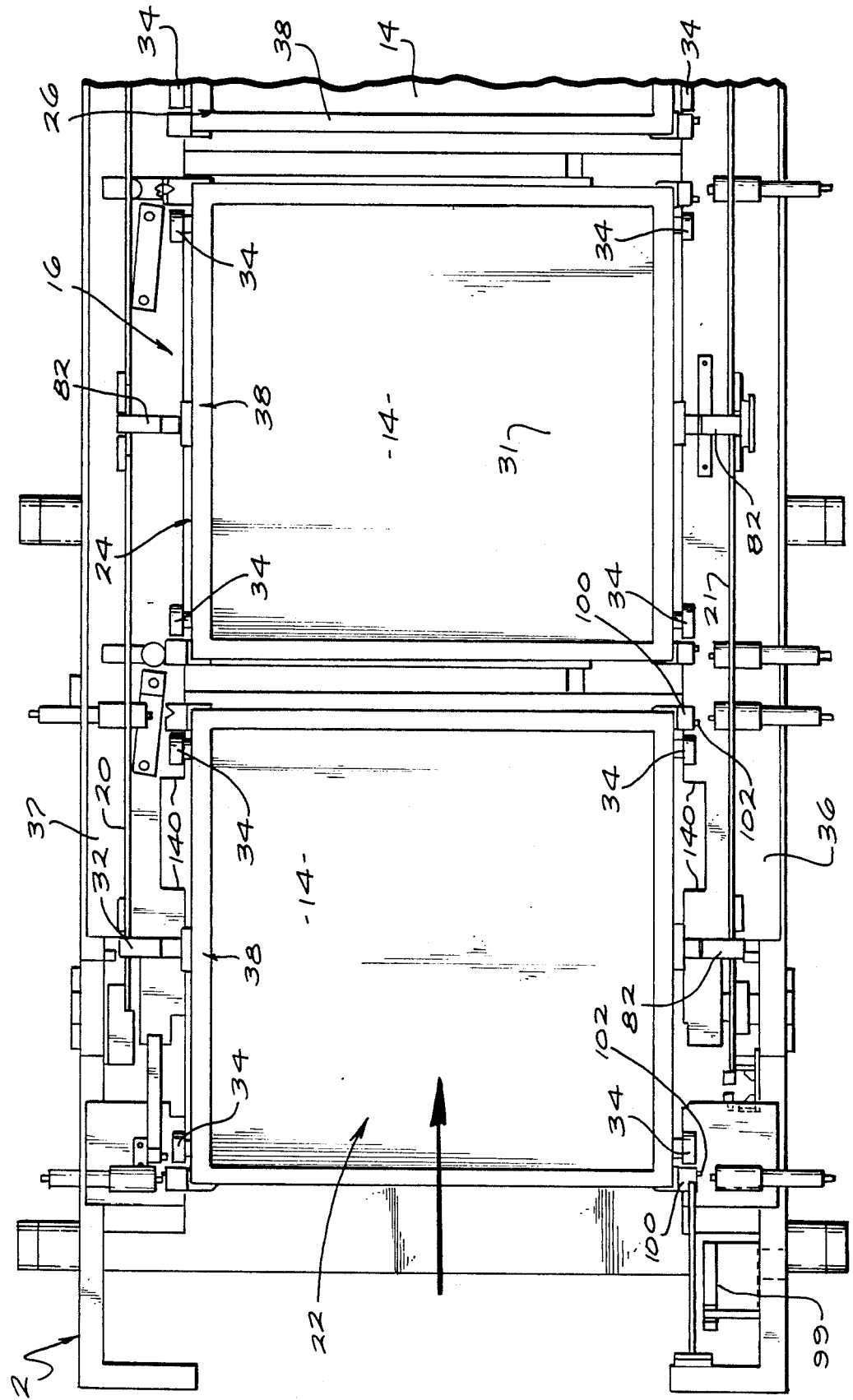

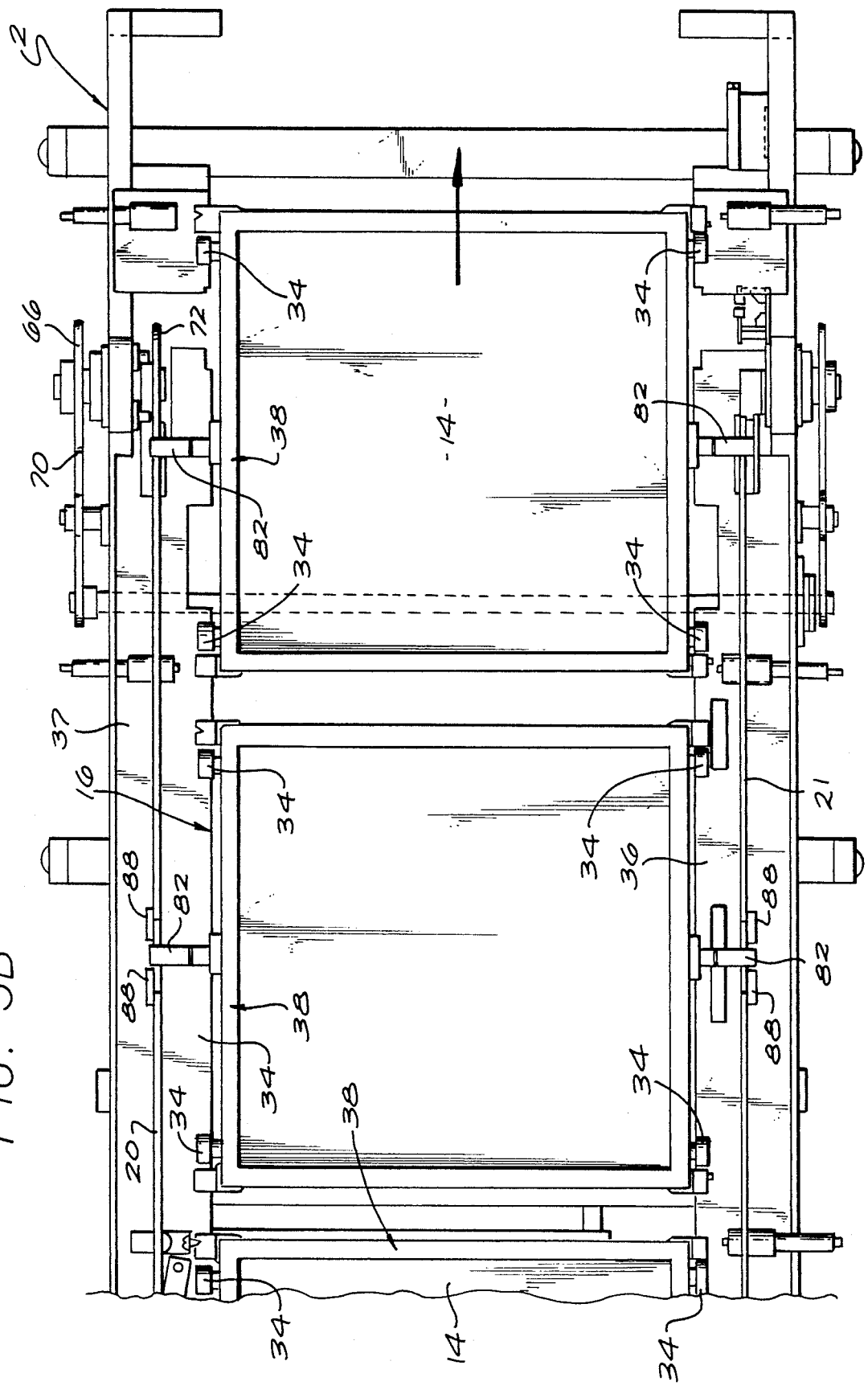

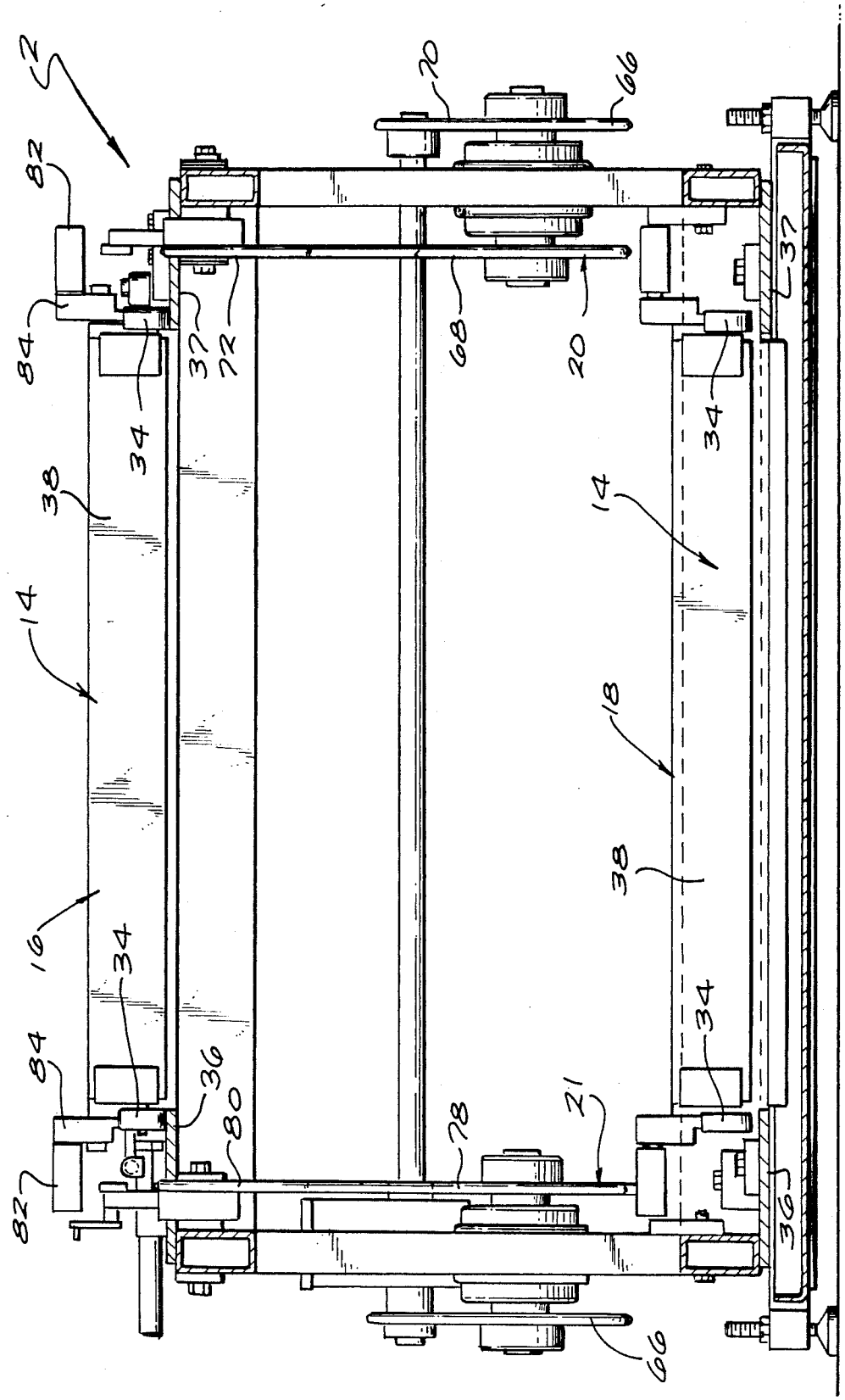

BOARD-SUPPORTING ASSEMBLY FOR FLUID JET CUTTING SYSTEM

BACKGROUND OF THE INVENTION

This invention relates to a method and apparatus for handling and cutting boards of material.

One particular use for the invention described herein relates to the production of printed wiring boards, and the invention will accordingly be explained in terms of that use with the recognition that those skilled in the art will appreciate the broader scope of application.

Printed wiring boards comprise a relatively flat, layer of electrically insulative base material bearing a pattern of electrically conductive strips or paths. Electrical components are mounted on the board and are interconnected with each other by the conductive paths. The term "printed wiring board", as used herein, is meant to include boards whether or not populated by electric components.

Printed wiring boards are manufactured by initially forming the component-receiving holes in, and etching the pattern of electrically conductive paths on, the base material to form a base laminate. The base material is secured during the manufacturing processes by tooling adapted to interface with the process equipment while accomodating the particular shape and size of the board. In order to accommodate the endless variety of board shapes and sizes while maximizing the use of standard sized tooling, the circuits for a plurality of printed wiring boards are etched onto a masterboard of base material which is subsequently cut into the smaller individual boards that will hold the components.

The masterboard has heretofore been cut into individual boards by means such as routing or shearing, and has typically been cut prior to component insertion for a variety of reasons. For example, routing typically requires a $\frac{1}{8}$" or $\frac{1}{4}$" path, making it difficult to fit the router between adjacent components of neighboring populated boards.

Additionally, routing is generally economical only if the boards can be stacked, permitting several masterboards to be cut simultaneously. The stacking of the printed wiring boards has accordingly required that the boards be unpopulated.

Shearing not only requires substantial clearance between adjacent electrical components of neighboring populated boards, but also subjects boards to mechanical shock which can dislodge or damage electrical components mounted on the masterboard.

Cutting has typically been performed by one of two methods. The first cutting method, sometimes referred to as the full cut, simply entails the cutting and separating of the individual boards from the masterboard after the electrically conductive paths have been etched. Following the cutting of the individual boards, the electrical components are inserted and soldered in place. The populated boards are then typically tested and passed on to be used in the electrical units for which they were made.

The aforementioned "full cut" method is cumbersome when populated printed wiring boards of varying sizes and shapes are to be produced automatically. The tooling fixtures used after the cutting process, during such operations as automatic component insertion, wave soldering, and the like, must be capable of interfacing with the particular printed wiring board and each machine performing a step in the post-cutting process. Accordingly, tooling fixtures must be available for each of the individual board sizes and shapes, and the tooling must be changed in mid-production to accommodate the individual boards rather than the relatively standard sized masterboard.

The change in tooling subsequent to the cutting operation imposes an unwanted expense on the manufacturer. Besides the cost of the tooling itself, there is also additional labor cost when tooling must be changed in mid-production. To decrease the cost, associated with the parts and labor required by the use of multiple tooling, it is desirable to produce individual printed wiring boards of any shape or size on an automatic production line utilizing tooling of a standard size and shape.

To avoid the tooling changes required subsequent to the "full cut" operation, a second cutting method, referred to as the tab cut method, provides a means by which the individual boards can be maintained as one integral masterboard during a number of post-cutting operations. In the tab cut method, the tooling is sized to fit a masterboard of standard size and shape. The cut about the perimeter of each individual board is incompletely made so that each of the individual boards remain connected to the masterboard by means of a plurality of narrow tabs, approximately 2-3mm wide. The individual boards can thereafter undergo automatic insertion of electrical components, wave soldering, etc., as a single unit, without the need to change tooling. The tabs may then be broken and the boards separated.

While reducing tooling change, the tab cutting method introduces its own set of limitations. For example, the remnants of the tab may need to be sheared off and the previously tabbed region reworked to meet established standards regarding edge quality of the board. Consequently, additional processing steps may be introduced, with related additional expense and the potential for electrical component damage.

In addition to creating added expense, shearing is becoming increasingly impractical. While shearing involves the cutting of a straight edge, the electronics industry is increasingly producing odd-shaped boards to accommodate more complex circuitry which must fit into equipment housings having limited space. Thus, it is becoming increasingly desirable to provide printed wiring boards with curved or complex shaped edges, rather than straight edges. Further, shearing subjects the board to potential component-damaging mechanical shock, and is therefore undesirable, particularly where more shock-sensitive digital and/or surface-mounted components are mounted on the board.

SUMMARY OF THE INVENTION

Briefly, the invention herein comprises a method and apparatus for supporting a board of material in a cutting system for cutting the masterboard into component boards. The system comprises a cutting head which includes means for forming a high velocity jet of fluid which cuts the material. The board-supporting apparatus includes a support surface of generally resiliently compressable material underlying the masterboard. The material is adapted to cushion the supported board topography and restrain the supported board from moving Means are provided for maintaining the integrity of the board-supporting surface. As the board-supporting member is repeatedly cycled through the cutting system and consequently exposed to cutting action by the fluid jet. Accordingly, the other side of the compressable material is preferably bonded to a lattice-like structural network of relatively uncuttable material, minimizing migration of the board-supporting material towards the cutting jet.

BRIEF DESCRIPTION OF THE DRAWING

FIGS. 2A and 2B are a rear elevation view, in schematic, of a multi-station system constructed in accordance with the invention;

FIGS. 3A and 3B are a plan view of a multi-station system constructed in accordance with the invention;

FIG. 4 is a sectional view of a multi-station system constructed in accordance with the invention, taken along line 4—4 in FIG. 2B;

FIG. 9 is a fragmentary end elevation view of the drag link assembly illustrated in FIG. 5;

DESCRIPTION OF THE PREFERRED EMBODIMENT

Figure 1:
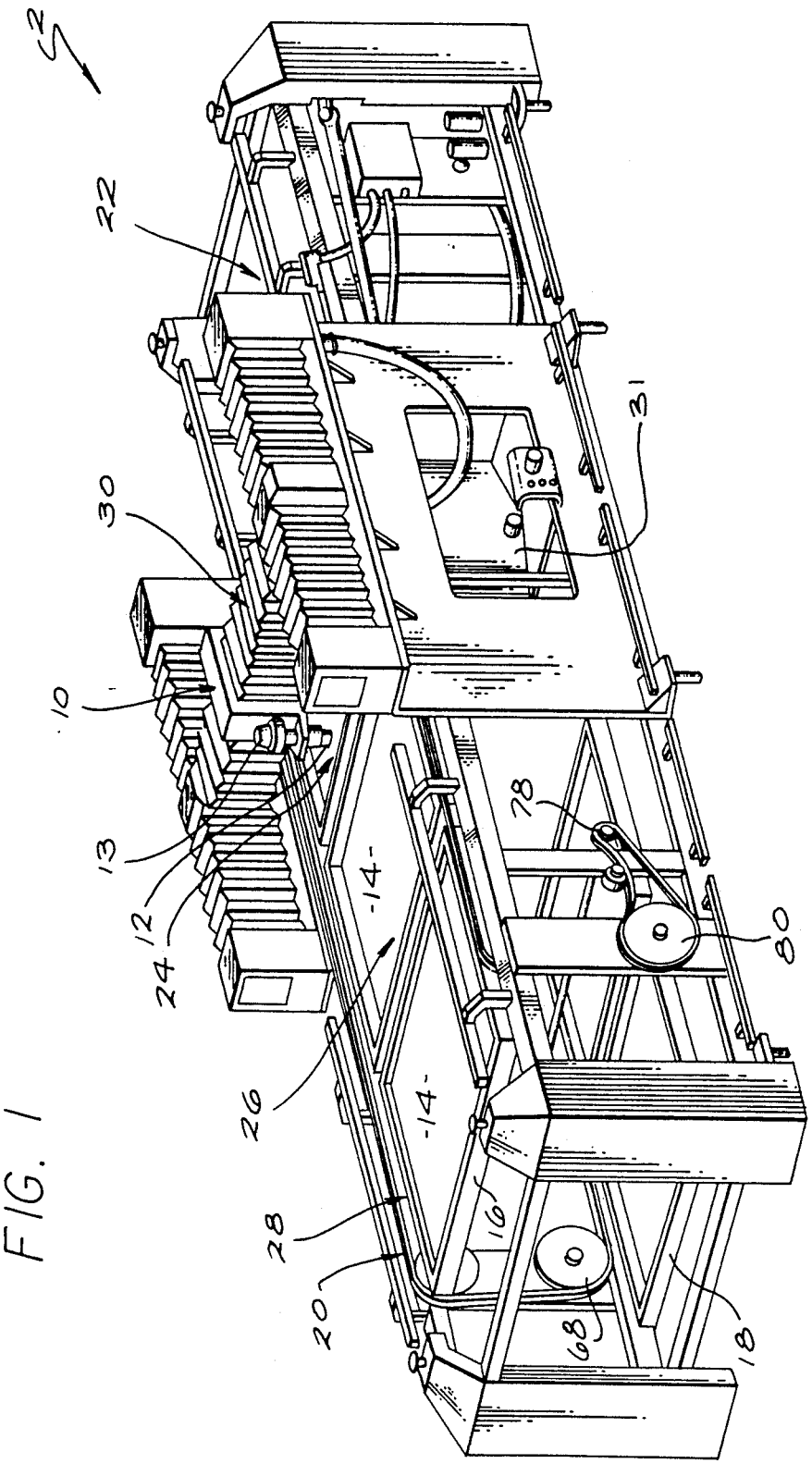
FIG. 1 is a perspective view of a multi-station system constructed in accordance with the invention.

FIG. 1 is a perspective view of a preferred multi-station system for cutting a masterboard of material into component pieces. The system comprises a system frame 2 supporting an X-Y table 30. A cutting head 10 is mounted for movement in two dimensions on the X-Y table and includes a high pressure fluid nozzle 12 in fluid communication with a high pressure fluid intensifier 13. Pressure intensifiers are well-known in the art; one such intensifier is the subject of U.S. Pat. No. 3,811,795 assigned to the assignee of this invention, the contents of which are hereby incorporated by reference. The nozzle 12 forms a high velocity jet of fluid, such as water, having a diameter of approximately 0.003 to 0.014 inches and a speed of almost 3000fps. The fluid jet is the cutting medium which cuts a masterboard lying 0.10 to 2.50 inches below the nozzle on a generally flat, rectangular platen 14.

As illustrated in FIGS. 1,2A–B,and 3A–B, a plurality of generally flat, rectangular platens 14 are supported by the system frame 2 at a like plurality of stations. The platens 14 are adapted to support both populated and unpopulated masterboards. In the illustrated embodiment, four such platens 14 are supported at an upper level 16, while four additional platens 14 are supported at a lower level 18 that co-extensively underlies the upper level. While the illustrated system comprises eight platens 14, evenly divided between the upper level 16 and the lower level 18, those skilled in the art will recognize that the number and distribution of platens may vary widely.

While each platen 14 is adapted to support a tooling plate, a tooling plate 15 is illustrated only on the left-most platen 14 in FIG. 3A. The tooling plate 15 has four apertures 15a–d through which the top surface of the platen is exposed. The four apertures define the cutting areas over which four masterboards are respectively placed utilizing index pins 17 as known in the art. Briefly, the index pins 17 fit within precisely located holes in the outter periphery of the master board. The surface of the tooling plate 15 circumventing the apertures supports the outter periphery of the master board, while the more interior portions of the master boards overlap the apertures.

As further shown in FIG. 1, a catcher 31 is positioned below the cutting station 24 between the upper and lower levels 16,18 . The catcher is an open-topped vessel which catches the spent cutting fluid and kerf material and dissipates the kinetic energy of the fluid jet. The catcher is moved vertically into contact with the bottom periphery of the platen occupying the cutting station. A seal circumscribing the top of the catcher contacts the underside of the platen to prevent noise and water from escaping between the catcher and platen. After the masterboard is cut, the catcher is moved downward and the platens are indexed to their next stations.

In addition to the cutting station 24, the disclosed system includes an on-load station 22 and an off-load station 28. While the on-load and off-load stations can be located at the same position, they are preferably located on opposite ends of the cutting station so that one masterboard may be on-loaded while the cut pieces of another masterboard are being off-loaded as part of an automated production line. A post-cut station 26 interjacent the cutting station 24 and off-load station 28 may be used for such operations as the cleaning or drying of cut printed wiring boards, or may remain unused.

In operation, a masterboard is placed on a platen at the on-load station 22, and sequentially transported on that platen to cutting station 24 for cutting by the high velocity jet of fluid from nozzle 12. Four cutting heads may be positioned over the four cutting areas to simultaneously cut the four masterboards. The supported cut pieces of the master sheet are thereafter transported to the off-load station 28 via the post-cut station 26.

Figure 2B:
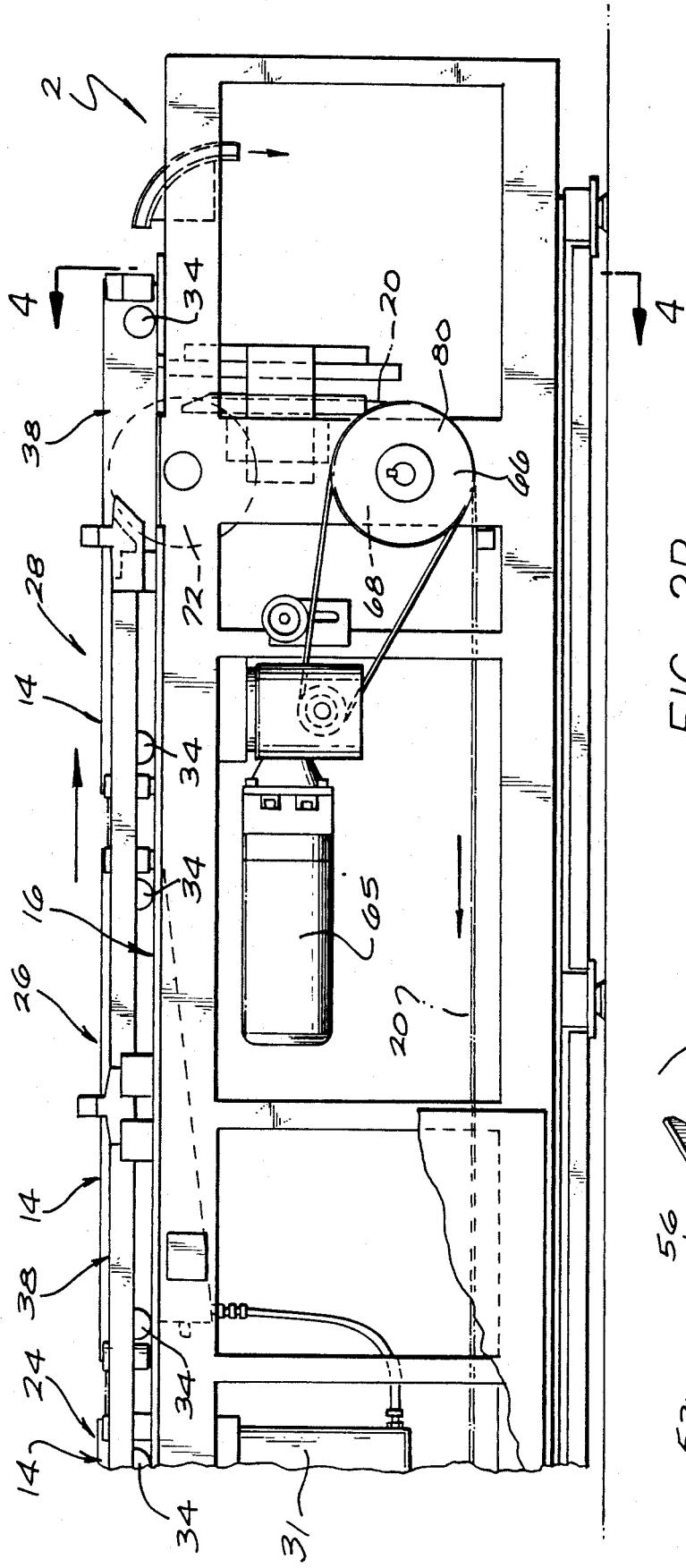

FIGS. 2A-B form a back elevation view of the system in schematic. Four platens 14 are schematically illustrated along the top level 16 of the frame. Each of the platens 14 are supported by four wheels 34, two being visible in the figure. The wheels 34 support the platen 14 on front and rear tracks 36,38 which respectively run along the front and rear edges of the system frame.

Reference is made to FIG. 4, which is a cross-section view of the system, taken along line 4—4 in FIG. 2B. As shown in FIG. 4, the system frame 2 has inwardly-extending front and rear ledges, or tracks 36,38 at both the upper and lower levels. The tracks 36,38 extend the length of the system frame.

The platens 14 are moved along the tracks on wheels 34 by conveyor drive belts, such as drive chains 20, which extend along the outer edges of the front and rear tracks. The platens are coupled to the drive chains 20 by drag links 82 for movement along the tracks on wheels 34.

Figure 5:
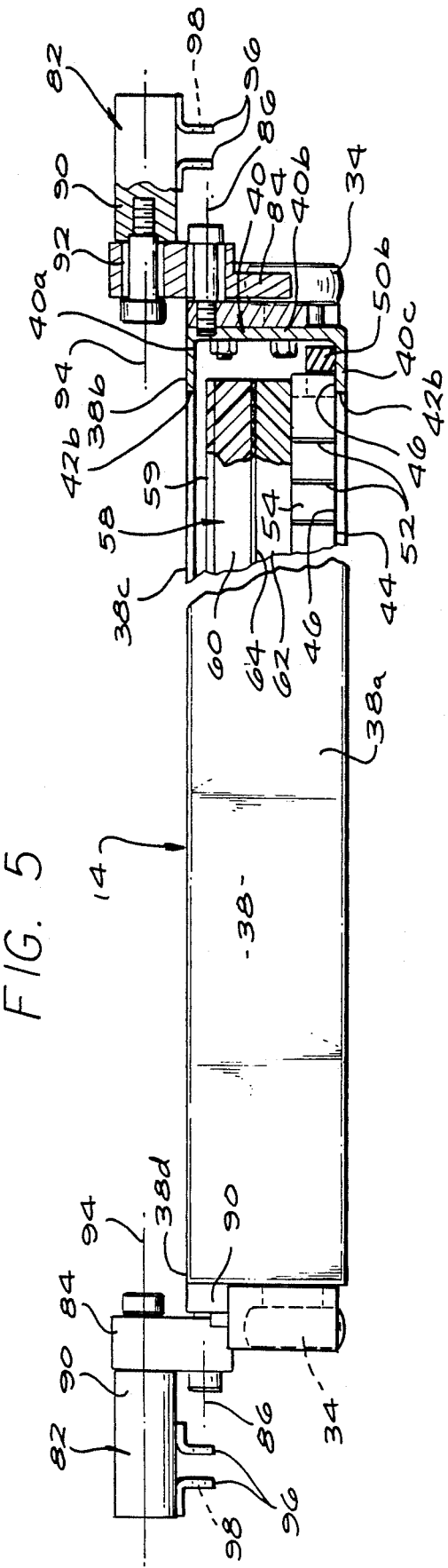
FIG. 5 is an end elevation view in partial section of a board-supporting member for use in a system constructed in accordance with the invention and taken along line 5—5 in FIG. 6.
Figure 7:
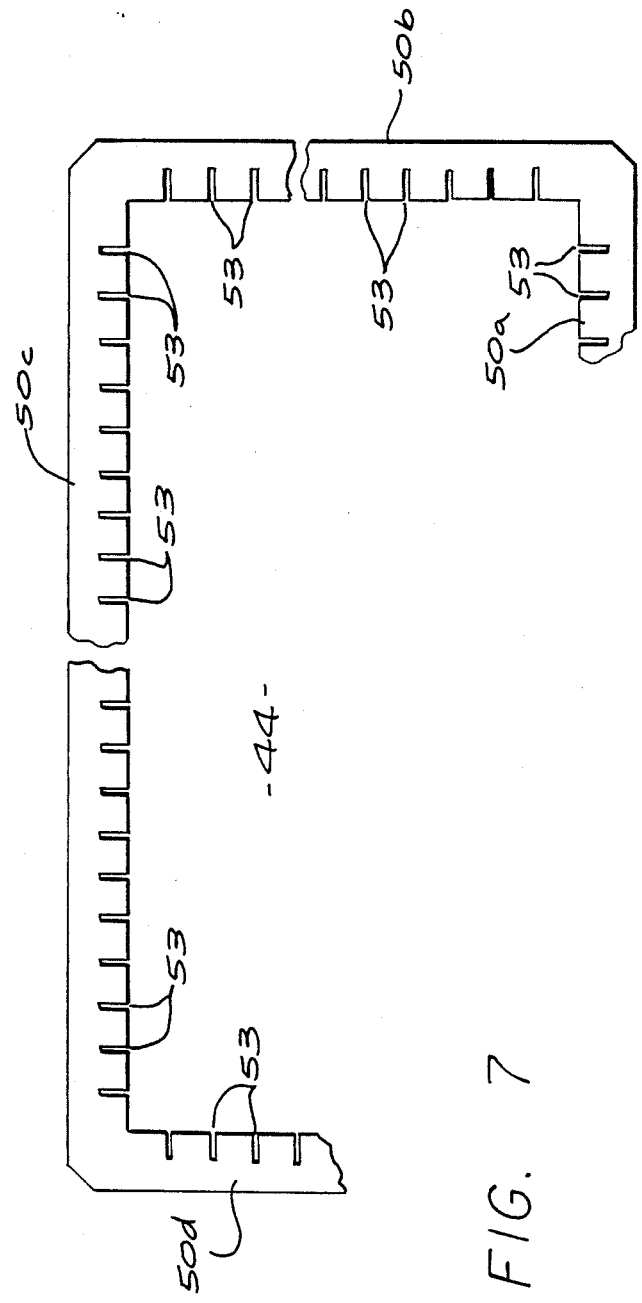
FIG. 7 is a fragmentary plan view of a grid-supporting component used in the board-supporting member of FIG. 5.
Figure 6:
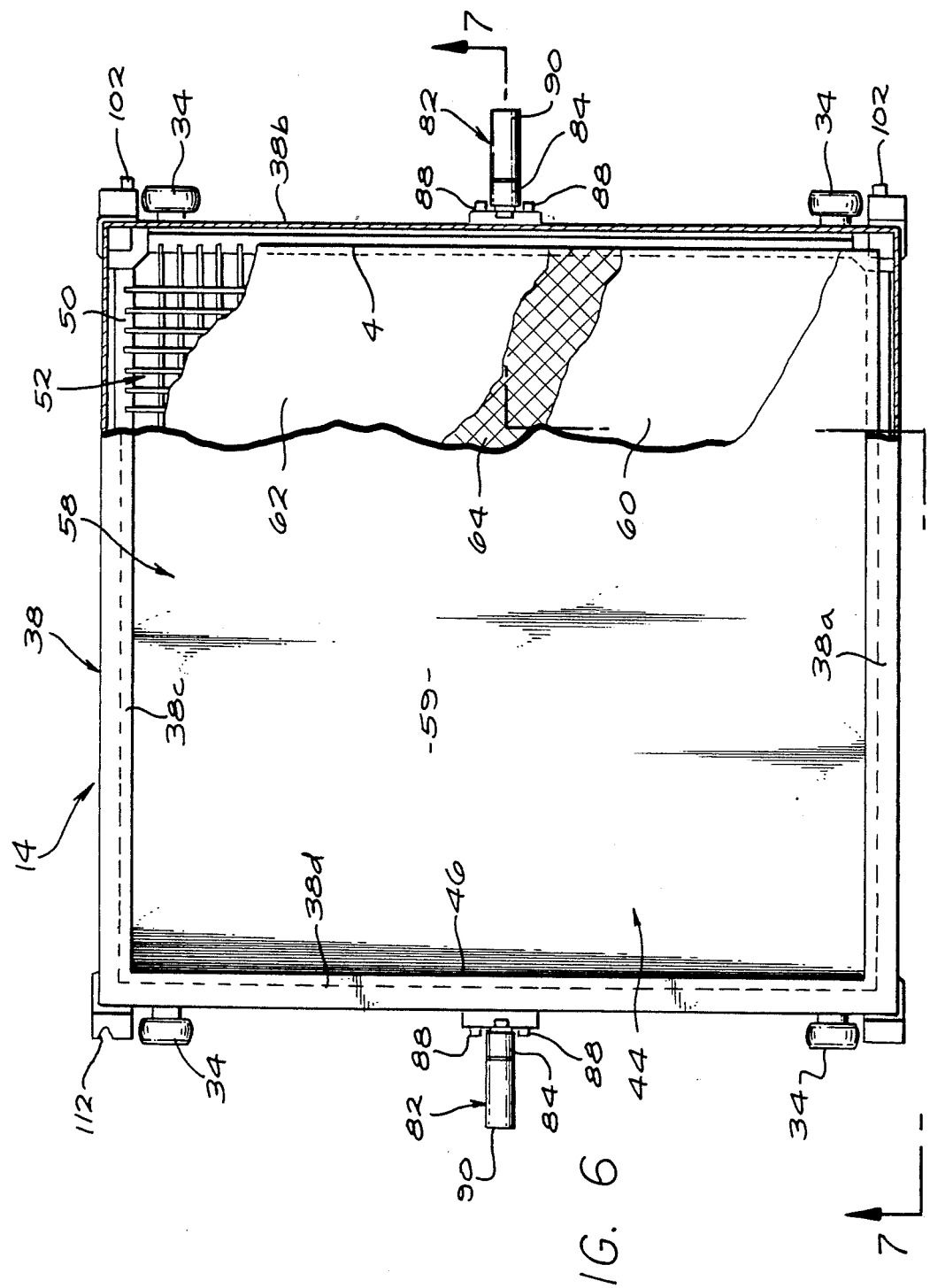
FIG. 6 is a plan view in partial section of a board-supporting member for use in a system constructed in accordance with the invention.

The construction of each platen 14 is more clearly shown in FIGS. 5-7. FIG. 5 is an end elevation view in partial section of a platen 14, while FIG. 6 is a plan view in partial section. As shown in FIGS. 5 and 6, the platen 14 comprises a frame 38 formed from a material such as extruded aluminum. The frame 38 comprises four generally C-shaped frame members 38a-d having inwardly-extending top and bottom legs, the bottom leg 40c of frame member 38b being shown in FIG. 5. The inwardly facing edges of the legs, such as edge 42c of the leg 40c, define a generally central opening in the bottom of the platen 14. The upper surface of the inwardly-extending bottom legs define an inner peripheral ledge 46 which circumscribes the central opening 44.

The ledge 46 supports a grid assembly 54 positioned within the lower portion of the platen. The grid assembly 54 is shown in section in FIG. 5, and in plan view in FIG. 6. It comprises a locater frame, formed from four locater strips 50a-d (FIG. 7), and a matrix of grid elements 52. The locater frame is preferably formed from rubber or other resilient material and circumscribes the central opening 44 of the platen 14. Disposed along the length of each locater strip 50a-d is a plurality of notches 53. The notches 53 are cut into the top and inwardly-facing faces of each locater strip, and are aligned with the notches 53 on the opposite side of central opening 44 so as to receive the ends of grid elements 52 forming the grid matrix.

Figure 8:
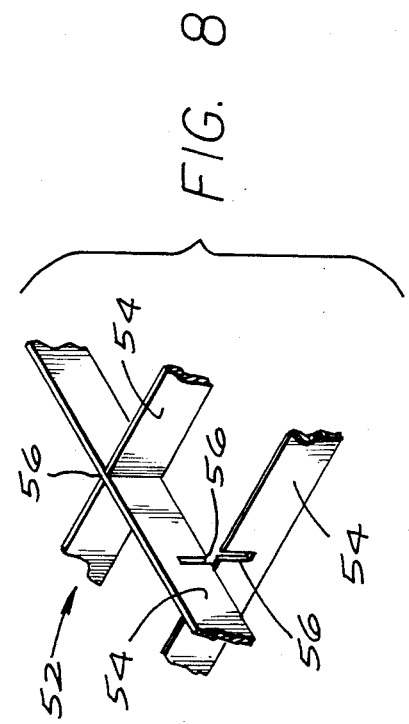
FIG. 8 is a fragmentary view in perspective showing three grid elements used in the board-supporting member shown in FIG. 5.

FIG. 8 is a fragmentary view, in perspective, of three grid elements constructed in accordance with the invention for forming the grid matrix. Referring to FIG. 8, each grid matrix element 52 is formed from stainless steel approximately 1 inch high and 0.022 inches thick. Stainless steel is preferred because of its strength and resistance to corrosion. The elements are oriented so that their approximate 1 inch dimension lies in the vertical plane.

Each of the elements 52 contains a plurality of vertically extending slots 56 disposed along its length. The slots extend to the midpoint of the element's vertical dimension and are spaced so that each intermates with a respective similar slot in an intersecting grid element.

The opposite ends of each element 52 are placed in opposing notches 53 (FIG. 7) of the locater frame so that the element 54 extends across the central opening 44 of the platen. The notches 53 are dimensioned so that they firmly hold an end of a respective member 54. Owing to the flexibility of the rubber material, however, the notches can be spread slightly and the members easily removed from the slots for replacement.

Returning to FIG. 5, an insert assembly 58 is supported by the matrix assembly within the confines of the frame members 38a, d. The insert assembly 58 comprises upper, middle and lower layers 60, 62, 63 respectively, which are bonded together.

The upper layer 60, preferably a compressible foam rubber such as quarter inch EVA (ethylvinyllacetate) or neoprene, is selected to provide a number of functions. First, it is compressed slightly by the leads and/or components on the underside of the masterboard so that those leads and/or components act as an anchor against movement of the masterboard. A density of 2-4 lbs/cu.ft. has been found to provide suitable compressibility. The slightly compressible material further serves to cradle those leads and components and minimize the risk of their breakage during processing.

The upper layer 60 material also acts as a barrier which prevents splashback of the partially spent fluid jet after it has passed through the masterboard. An upper layer which is resistant to fluid absorption is also desirable to minimize wetting of the board and mounted components. To prevent the fluid from being absorbed by the upper layer, its material is preferably formed from a closed cell foam.

The middle and bottom layers 62, 63 may each conveniently be a 1 inch thick layer of inexpensive, rigid foam or plastic such as styrofoam or polyethelene. The upper layer 60 and middle layer 62 are bonded together by means such as water-insoluble contact cement, while the middle and bottom layers 62, 63 are similiarly bonded to opposite faces of an interjacent mesh 64, formed from a material such as common chicken wire.

The mesh stabilizes the insert assembly by holding the board-shaped cut-out and surrounding insert material together during the cutting process. The mesh material is accordingly selected to substantially withstand being cut by the fluid jet as the fluid from the cutting nozzle passes downward through the insert assembly. In practice, when layers of the aforementioned materials and thickness have been used, the kinetic energy of the fluid impinging on the mesh has been found sufficiently low at that distance from the nozzle to enable common chicken wire to be successfully employed. Accordingly, the insert assembly can be used for a substantial number of cutting cycles before replacement is needed.

Without the bonded mesh, the cut-out would be quickly consumed, requiring replacement of the insert assembly after relatively few cutting operation. The mesh 64 prevents the materials 60, 62 on opposite sides of a cut from migrating towards the cut. Migration is attributable to a low pressure region surrounding the flowing fluid, which pulls the layers towards the cutting fluid jet. The presence of a low pressure zone surrounding a flowing fluid is well known in physics as the Bernoulli principle. The resulting migration can cause a general erosion of the materials as migrating material is subsequently cut by the fluid jet when the platen returns to the cutting station with a new masterboard. Migration can not only shorten the life of the insert assembly, but can also cause movement of the supported masterboard, resulting in registration errors. Further, any lateral movement of the masterboard, with respect to the cutting direction, during the cutting process causes the angle of the board's edge to change, resulting in potential damage to the board.

Because movement of the masterboard can be a source of numerous errors, an additional precaution against such movement is taken by applying a slight vacuum to the underside of the masterboard. A plurality of generally vertically extending, one-inch diameter through-holes are provided through the upper and lower layers, so that a vacuum source may be coupled to the underside of the insert assembly, thereby pulling the supported masterboard against the insert assembly 58. The platen insert assembly can easily be replaced when unacceptable splashback occurs or when the top layer will no longer support the cut components.

The platens thus described are transported to and from the cutting station by a conveyor assembly illustrated in FIGS. 1 and 2A-B. The conveyor assembly comprises a drive in the form of electric motor 65 and a pair of laterally spaced driving gears 66 (FIG. 4). The driving gears 66 are respectively mounted adjacent the front and rear of the system frame.

Referring to FIGS. 2A and 2B, the rear driving gear 66 is coupled via a chain or drive belt 70 to a first driven gear 68 mounted for rotation at the lower rear corner of the system frame. The rear first driven gear 68 is coupled by conveyor drive chain 20 to second through fourth driven gears 68,72,74,76, respectively, mounted for rotation adjacent the remaining three corners on the rear side of the system frame. The conveyor drive chain 20 is looped about the four driven gears 68,72,74,76 to form a rear transmission drive belt, the upper portion of which extends along the rear of the system frame generally co-extensive with, and behind, the rear track 38.

As illustrated in FIG. 1, a front transmission drive belt is similarly formed by a second conveyor drive chain 21, looped around driving gear 78, driven gear 80, and three other driven gears not visible in FIG. 1. The front transmission drive belt extends along the front of the system frame generally coextensive with, and in front of, the front track 36.

As shown in FIGS. 3A-B and 4, the platens 14 are coupled to the conveyor drive chain by a pair of drag link mechanisms 82 respectively mounted on the transversely opposite frame members 38a,38c of platen 14. As best shown in FIG. 5 and 9, each drag link mechanism comprises a mounting plate 84 mounted for rotation on the respective frame member about axis 86. Rotation is limited to a few degrees on either side of the vertical by stops 88 mounted on the frame member adjacent both sides of the mounting plate 84.

A coupling member 90 is coupled to the mounting plate 84 by an shaft 92 which permits the coupling member 90 to rotate with respect to mounting plate 84 about a transversely extending axis 94. The shaft is mounted for limited sliding movement within the coupling member to additionally permit a limited degree of transversely directed movement between the coupling member and mounting plate.

The coupling member 90 includes a pair of outwardly extending legs 96. In FIGS. 5 and 9, the coupling mechanism 90 has been rotated about axis 94 so that the legs 96 extend generally downward. When the platen 14 is mounted on the system frame, the coupling member 90 is oriented across the adjacent conveyor drive chain so that a link of the drive chain is interjacent the legs. The legs have a pair of generally co-axial through-holes 98 for receiving a link pin. The platen is coupled to the conveyor drive by pushing the link pin through the holes 98 and, consequently, through the interjacent pin-receiving hole of the chain's link.

The conveyor drive system accordingly transports the platens 14 from station to station under microprocessor control, pausing while the board at the cutting station is cut. A platen 14 is thus successively transported across the upper level 16 from the on-load station to the cutting station, the post-cut station and the off-load station. From the off-load station 28, the platen is lowered to the lower level 18 of the system frame for return to the on-load station 22 at the opposite end of the upper level 16.

During their transition between levels, the platens retain their orientation by means of an orientation-maintaining guide system which operates in cooperation with the coupling member 90 (FIG. 5). By the term "retain their orientation" it is meant that the upwardly-facing surfaces of the platens remain upwardly facing at both levels in the system frame, as well as during the transition from on level to the other.

Figure 10:
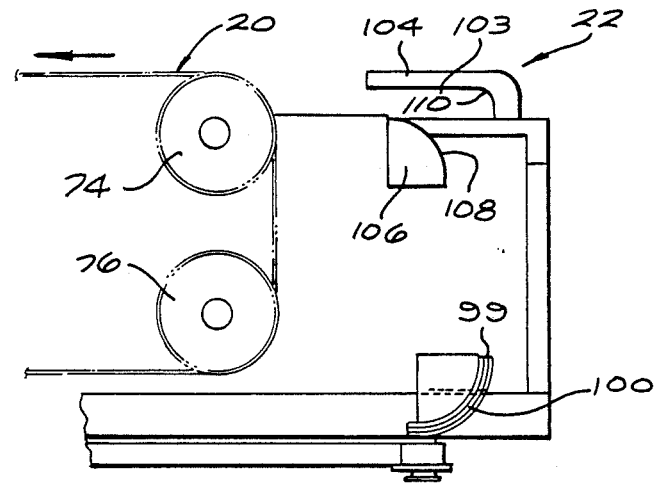
FIG. 10 is a fragmentary front elevation vie in schematic showing means constructed in accordance with the invention for retaining the orientation of level-transiting board-supported members.

Reference is initially made to FIG. 4, an end view in section taken along line 4—4 in FIG. 2B, and to FIG. 10. For clarity, a number of system components which are unrelated to the orientation-retaining feature of the system have been omitted.

FIG. 4 shows a platen 14 in broken lines at the bottom level in the system frame, and in solid lines at the top level. The platen 14 is elevated to the upper level by the coupling blocks 90 of drag links 82, respectively coupled to the front and rear conveyor drive chains 21,20. As the chain links to which the coupling blocks are attached rotate about the peripheries of the respective driven gears, the coupling blocks rotate about their respective axes 94 (FIG. 5) sufficiently to permit the platen to retain its orientation. To prevent the platen from tipping, at least one of the lower level tracks terminate in a guideway 99 (FIG. 10) which serves to guide the leading end of a level-transitting platen.

As shown in FIG. 10, the guideway 99 has a curved, inward-facing slot 100 formed in its inner-facing side. The slot 100 has a center of curvature coincident with the center of rotation of driven gear 76, so that the leading end of the platen will follow a path which is essentially parallel to the path of the drag link traveling about the periphery of the driven gear 76.

The guideway 99 guides the leading end of a level-transitting platen by engaging an outwardly-extending pin affixed to the platen frame. As shown in FIG. 3A-B, the rear leading ends of frame members 38a,c of platen 14 accordingly include contact blocks 101, adjacent the leading wheel 34, from which guide pins 102 extend generally laterally. The guide pins 102 extend laterally outward from the platen and are positioned to fit within the grooves 100 (FIG. 10) as the platen 14 reaches the end of the bottom track. As the drag link 82 is pulled around the periphery of driven wheel 76, the pin 102 is guided in a parallel arcuate path to maintain the platen's orientation.

When the platen reaches the upper level, its direction of travel reverses, and its formerly leading end consequently becomes its following, or distal, end. As the platen reaches the top of the transition path, a similar anti-tipping function is provided by a gap 103 (FIG. 10) formed between a pair of system frame members 104,106. Member 106, affixed to the top rear corner of the system frame, has a generally curved, downward-facing edge 110 which cooperates with the top edge 108 of similarly affixed member 106 to define the gap 103. The cooperating edges of the members 104,106 guide the distal end of the platen by acting as stops against the edge of contact block 101 if the platen begins to rotate from its orientation. The platen 14 is prevented from tipping about the drag link because the contact block 101 is contacted by the upwardly facing surface 108 of member 106 or, alternatively, the downward facing surface 110 of member 104. The top of surface 108 is flush with the upper wheel track to smoothly guide the platen 14 wheels onto the track.

Figure 12:
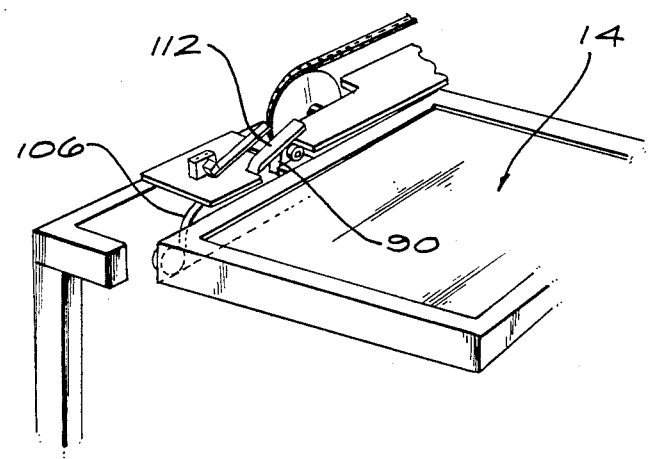
FIG. 12 is a fragmentary perspective view of a portion of the system frame.

Referencing FIG. 12, each drag link of a level-transitting platen 14 passes upward through the upper level tracks via a vertically-opening hinged hatch 112 whose top surface forms a segment of the upper track. The hatch 112 is positioned immediately adjacent the driven gear to be contacted by the rising top surface of the drag link coupling member 90. As the coupling member 90 contacts the bottom surface of the hatch 112, the hatch opens about its hinge 114, permitting the drag link to pass through the track. Once the drag links have passed through the hatches, the hatches close to permit the subsequent rolling of the distal platen wheels over the top hatch surface.

Returning to FIGS. 3A and 9, the leading platen wheels 34 (i.e. leading at the upper level) pass through longitudinally extending slots 140 formed in the upper level tracks as the platen transits to the upper level. To prevent the lagging wheels 34 from passing downward through those slots as the platen moves longitudinally to the on-load station, a downwardly-facing, generally longitudinally extending guideway 142 is provided on a standoff 143 above one of the upper tracks. The guideway 142 is longitudinally spaced from the slot by an amount equal to the longitudinal distance between the platen wheels so that the downwardly-facing guideway receives the outwardly-extending guide-pin 102 adjacent a leading wheel as the logging wheels of the platent approach the gap 140. As the leading wheels tend to pass downward through the slot, the platen rotates about drag links, causing the lagging end of the platen to move vertically upward. By blocking the upward vertical movement of the longitudinally sliding guide-pin 102, as the lagging platen tips downward the bottom surface of the guideway 142 slot prevents the leading wheels of the platen from falling into the slots 140. The guideway is preferably formed from a material having a low co-efficient of fuel and low wear rate, such as VHMW polyethelene.

To accurately locate the platens for automatic on-loading and off-loading, the platens are indexed at the on-load and off-load stations by means of a series of pneumatically actuated push rods, mounted along the front and rear upper tracks, acting upon respective index blocks affixed to the platen frame members. As illustrated in FIG. 3A-B, index blocks 120 are affixed to the front leading ends of laterally spaced frame members 38d adjacent the wheel 34. The index blocks 120 each have an outward-facing, generally concave or v-shaped notch 122 which provide a self-centering action in the direction of platen travel when contacted by transversely-extendable push rods from a first pair of air cylinders 116,118.

The first pair of air cylinders 116,118 are located adjacent the front track of the onload station and are positioned to push the platen towards the rear of the system frame. The air cylinders 116,118 are provided with 1.5 inch bores so that each develops approximately 114 lb# of force at the working system pressure. A second pair of air cylinders 121,123 are located adjacent the back track at the onload station and are operable to push against the opposite side of the platen towards the front of the system frame. The second pair of cylinders are each provided with a 2 inch bore to produce approximately 200 lbs of force, slightly more than the force produced by the first pair of cylinders.

In operation, the platens are stepped under microprocessor control to the sequentially next stations. The front pair of cylinders 116,118 are fired under microprocessor control and held at their furthest extension. The rear pair of the air cylinders 121,123 are then fired by the microprocessor to push the platen securely against the pushrods of the first two, providing indexing of the platen both longitudinally in the direction of platen movement, and transversely thereto. A similar set of cylinders are provided at the off-load station and are operated similarly to ensure that the cut pieces of the masterboard are accurately positioned for removal by automated off-loading means.

Longitudinal movement of the platens, with respect to the stationary conveyor chain link to which they are coupled, is permitted by the allowable degree of rotation afforded mounting plate 84 about axis 86 (FIG. 5) and the slight consequential rotation of coupling member 90 about axis 94.

Figure 11:
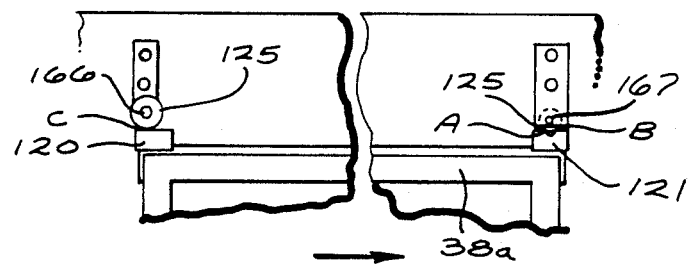
FIG. 11 is a fragmentary plan view in schematic showing means constructed in accordance with the invention for indexing the board-supporting members at the cutting station.

For greater indexing accuracy, a different indexing system is employed at the system's cutting station to hold the platen in translational and rotational register. As shown in FIG. 11, a pair of longitudinally-spaced cylindrical index stops 124,125 are mounted adjacent the front track for rotation about generally vertical axes 126,127 respectively. The clylindrical indexing stops 124,125 are respectively positioned to be contacted by the leading and lagging contact blocks 120,121 which are affixed to the front-facing member 38a of the platen frame. A pair of longitudinally spaced mechanical push rods 128,130 (FIG. 3A) are positioned adjacent the rear track at the cutting station to push transversely against the platen when extended. The push rods contact the contact blocks 120 affixed to the back-facing platen frame member, forcing the front-facing contact blocks against the index stops.

The index stops are accurately located relative to the cutting nozzle to permit accurate locating of the platen by the nozzle under microprocessor control. The index stops contact the platen at three points for accurate indexing. As shown in FIG. 11, the concave notch formed in the leading contact block 120 contacts the index stop 125 at two points A,B, referencing the platen relative to the center of the cylindrical stop 125 in both the transverse and longitudinal directions. As shown in FIG. 11, the lagging contact block 120 contacts the other index stop 125 at a single point C, registering the platen rotationally about the center of cylindrical stop 125.

In operation, a master panel is placed on located pins of the tooling on the platen 14. The conveyor drive is engaged and the master panels are carried to the cutting station. When the panel is in place, the driving gear is disengaged and the indexing mechanisms are engaged to securely index the platens in position during the cutting sequence.

The catcher is raised into sealing contact with the bottom of the platen occupying the cutting station and the nozzle actuated to produce a fluid jet which cuts through the masterboard and passes through the platen into the catcher. The cut components of the masterboard rest on the platen insert until off-loaded. After the cutting pattern is completed, the nozzle is shut-off, the cached lowered to disengage it from the platen, and the index mechanisms are disengaged. The conveyor drive is engaged to transport the platen bearing the cut masterboard to the next station, while bringing a platen bearing the next masterboard to the cutting station. As the platen bearing the cut masterboard begins to move from the cutting station, the cylindrical index 125 relates about its axis in response to the force exerted on the cylinder by the contact block at point B. The cylinder's rotation allows the platen to move transversely towards the rear of the system frame as it is pulled longitudinally by the drive chains, enabling the v-notch of the contact block 121 to circumvent the index stop as the platen is transported from the cutting station.

The above process is repeated, with the newly arrived platens at the on-load and off-load stations being loaded and unloaded, respectively while the newly arrived masterboard is cut at the cutting station.

While the foregoing description includes detailed information which will enable those skilled in the art to practice the invention, it should be recognized that the description is illustrative and that many modifications and variations will be apparent to those skilled in the art having the benefit of these teachings. It is accordingly intended that the invention herein be defined solely by the claims appended hereto and that the claims be interpreted as broadly as permitted in light of the prior art.

We claim:

1. A fluid jet cutting system of the type employing a high velocity fluid jet as the cutting medium to cut a masterboard, said cutting system comprising:
   nozzle means for producing a high velocity fluid jet and directing said jet towards a masterboard of material to be cut;
   catcher means for capturing and dissipating the jet emerging from the masterboard; and
   a platen assembly for supporting the masterboard and including a layer of resiliently compressible material for supporting the masterboard material on its top surface, and a lattice-like network of relatively uncuttable structural bonded to the bottom surface of the layer of resiliently compressible material to form a non-migrating support surface from the cut pieces of masterboard.

2. The cutting system of claim 1 including means circumventing the compressible layer for supporting the masterboard about its generally peripheral portion.

3. The cutting system of claim 1 wherein the resiliently compressible material is selected from the group consisting of ethylvinyllacetate and neoprene.

4. The cutting system of claims 1 or 3 wherein the density of the material is in the range of 2-4 lbs/cu.ft.

5. The cutting system of claims 1 or 3 wherein the compressible material has a closed cell construction.

6. The cutting system of claim 1 further including a layer of relatively rigid material bonded to the lattice-like network so that the network is interjacent the two layers.

7. The cutting system of claim 6 wherein the relatively rigid material is selected from the group consisting of styrofoam and polyethelene.

8. For use in a cutting system of the type employing a high velocity fluid jet as the cutting medium, a platen assembly for supporting a masterboard of material to be cut and comprising:
   a layer of resiliently compressible material for supporting the masterboard material on its top surface;
   a lattice-like network of relatively uncuttable structural material bonded to the bottom surface of the layer of resiliently compressible material to form a non-migrating support surface for the cut pieces of masterboard; and
   a grid of structural support elements positioned below the lattice-like network to support the bonded compressible layer.

9. The assembly of claim 8 wherein the grid is formed from a plurality of elongated support elements, each having a plurality of element-receiving notches disposed along its length dimensioned to circumvent intersecting support elements.

10. The assembly of claims 8 or 9 including a peripheral frame-like member positioned about the outer periphery of the grid for releasably securing the ends of the support elements.

11. The assembly of claim 10 wherein the frame-like member has a plurality of element-receiving notches disposed along its length for receiving the ends of the support elements.

12. The assembly of claim 11 wherein the frame-like member is formed from a material adapted to resiliently release the end of the support element from the notch.

13. The assembly of claim 8 further including a layer of relatively rigid material bonded to the lattice-like network so that the network is interjacent the two layers.

14. The cutting system of claim 1 wherein the network is formed from steel.

15. A fluid jet cutting system of the type employing a high velocity fluid jet as the cutting medium to cut a masterboard comprising:
   nozzle means for producing a high velocity fluid jet and directing said jet towards a masterboard of material to be cut;
   catcher means for capturing and dissipating the jet emerging from the masterboard; and
   a platen assembly including (i) a relatively rigid frame member including surface defining means for supporting the outer peripheral region of the masterboard, and
   (ii) an insert assembly positioned within the frame for supporting the cut masterboard components and including a relatively compressible upper layer of component-contacting material, a relatively rigid inner layer of support material, and a lattice-like structural network of relatively uncuttable material bonded interjacent the inner and upper layers.

16. A platen assembly for use in a board cutting fluid jet cutting system comprising:
   a relatively rigid frame including surface-defining means for supporting the outer peripheral region of a masterboard;
   an insert assembly positioned within the frame for supporting the cut masterboard components and including a relatively compressible upper layer of component-contacting material, a relatively rigid inner layer of support material, and a lattice-like structural network of relatively uncuttable material bonded interjacent the inner and upper layers; and
   a grid of structural support elements positioned within the frame to support the insert assembly.

17. The system of claim 16 wherein the grid is formed from a plurality of support elements, each having a plurality of element-receiving notches disposed along its length dimensioned to fit around intersecting support elements.

18. The system of claims 16 or 17 including a peripheral bar-like member positioned about the outer periphery of the grid for releasably securing the ends of the support elements.

19. The system of claim 18 wherein the bar-like member has a plurality of element-receiving notches disposed along its length for receiving the ends of the support elements.

20. The system of claim 19 wherein the bar-like member is formed from a material adapted to resiliently release the end of the support element from the notch.

21. A method for cutting a masterboard bearing mounted electrical components into a plurality of separate printed wiring boards comprising the step of:
   laying the masterboard over a laminate structure having a masterboard-facing layer of material which is resiliently compressible by the supported masterboard topography and which is bonded to a lattice-like network of relatively uncuttable supporting material so that the compressible material is between the network and the masterboard; and cutting the masterboard into a plurality of separate printed wiring boards by directing a jet of high velocity fluid against the masterboard while providing relative movement between the jet and masterboard.

22. The method of claim 21 wherein the step of laying includes supporting the masterboard on the resiliently compressible layer.

23. The method of claim 21 wherein the step of laying includes laying the masterboard over a laminate structure having a board-facing layer of compressible material affixed to one side of a lattice-like network of relatively uncuttable supporting material and a layer of rigid cuttable material affixed to the other side of the network.

24. A method for restraining individual printed wiring boards against movement as they are cut from a populated masterboard by a high velocity jet of fluid comprising the step of:

supporting the masterboard on a layer of material which is resiliently compressed by the topography of the supported masterboard to exert a movement-restraining force thereon, the resiliently compressible material being bonded to a lattice-like network of relatively uncuttable material; and cutting the masterboard into a plurality of separate printed wiring boards by directing a jet of high velocity fluid against the masterboard while providing relative movement between the jet and masterboard.

* * * * *